United States Patent [19]

Sukeda et al.

[11] Patent Number: 4,630,236

[45] Date of Patent: Dec. 16, 1986

[54] CASSETTE-TYPE MAGNETIC BUBBLE MEMORY

[75] Inventors: Toshiaki Sukeda; Satoru Imai, both of Suzaka, Japan

[73] Assignee: Fujitsu Limited, Kawasaki, Japan

[21] Appl. No.: 529,638

[22] Filed: Sep. 6, 1983

[30] Foreign Application Priority Data

| Sep. 10, 1982 | [JP] | Japan | 57-157773 |
| Sep. 10, 1982 | [JP] | Japan | 57-157774 |
| Sep. 10, 1982 | [JP] | Japan | 57-157775 |
| Sep. 10, 1982 | [JP] | Japan | 57-157776 |

[51] Int. Cl.$^4$ ............................................. G11C 19/08
[52] U.S. Cl. ........................................................ 365/1
[58] Field of Search ................... 365/1, 2; 360/96, 90, 360/93, 96.5, 137; 242/97

[56] References Cited

U.S. PATENT DOCUMENTS 4,400,795  8/1983  Irie et al. .................................. 365/1
4,415,940  11/1983  Becker ..................................... 360/99

OTHER PUBLICATIONS

Electronic Products Magazine–May 1970, p. 149.

Primary Examiner—James W. Moffitt
Attorney, Agent, or Firm—Staas & Halsey

[57] ABSTRACT

A cassette type magnetic bubble memory having a magnetic bubble cassette and a cassette holder. The cassette is provided with a connector and contains within a case a magnetic bubble device comprising a magnetic bubble chip, a driving coil, a bias magnet and associated elements. The cassette holder has a cassette storing pocket and a connector to hold the magnetic bubble cassette with the corresponding connectors being connected to each other. An ejecting mechanism is provided for discharging the magnetic bubble cassette from the cassette storing pocket. An ejecting button controls the ejecting mechanism. A lid is provided in front of the cassette inlet of the cassette storing pocket. The lid is formed of a size capable of closing a cassette inlet of the cassette storing pocket and of concealing the ejecting button. The position of the lid is electrically detected.

8 Claims, 19 Drawing Figures

SPOT WELDING

CASSETTE-TYPE MAGNETIC BUBBLE MEMORY

BACKGROUND OF THE INVENTION

The present invention relates to a magnetic bubble memory, and more particularly to a magnetic bubble memory which employs a cassette-type magnetic bubble device for controlling the magnetic bubble to store and transfer information and which mounts the magnetic bubble cassette on a cassette holder connector.

Cassette-type magnetic bubble devices have recently come into greater use. At the same time, improvements have been made to facilitate mounting of the cassette on the holder. The easier it is to mount a cassette on a holder, however, the greater the possibility of inadvertant detachment of the cassette from the holder during the operation of the magnetic bubble device and the resultant loss of stored information. Accordingly, it is necessary to make doubly sure that such accidents do not occur.

SUMMARY OF THE INVENTION

It is an object of the present invention to provide a simple construction capable of meeting such requirements of cassette-type magnetic bubble memories.

Another object of the present invention is to provide a construction which allows easy mounting and detachment of the cassette, prevents faulty contacts and faulty connections, allows easy repair of the faulty connections and reinstating of the cassette, and prevents actuation of the magnetic bubble device in case of faulty connection.

The present invention provides an improvement of a magnetic bubble memory having a cassette comprising a magnetic bubble chip, a driving coil, a bias magnet, and associated elements, contained in a case and provided with a connector and having a holder capable of holding the magnetic bubble cassette by the connectors. The improvement comprises a mechanism for ejecting the cassette from the cassette pocket of the holder, an ejecting button for operating the ejecting mechanism, a lid of a size which is sufficiently large to close the cassette inlet of the cassette pocket as well as to cover the ejecting button and which is provided in front of the cassette inlet of the cassette pocket, and a means to generate an electric signal corresponding to the position of the lid.

BRIEF DESCRIPTION OF THE DRAWINGS

The drawings are representations of a cassette-type magnetic bubble memory embodying the present invention, in which.

DESCRIPTION OF THE PREFERRED EMBODIMENTS

Figure 1:
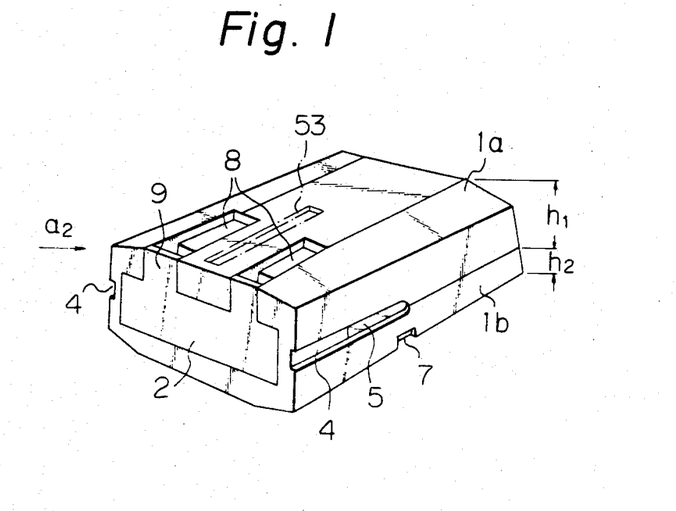
FIG. 1 is a perspective view of a magnetic bubble cassette with the lid closed.
Figure 2:
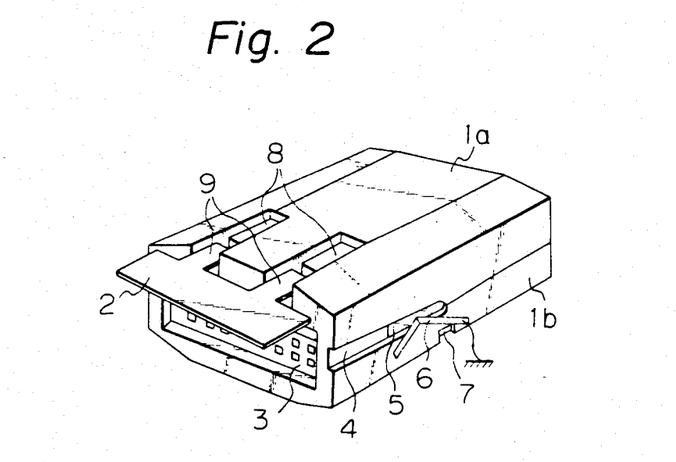
FIG. 2 is a perspective view of the magnetic bubble cassette with the lid opened.
Figure 3:
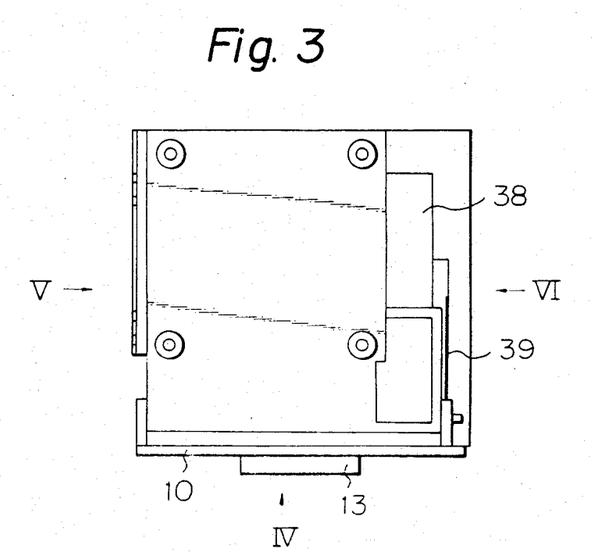
FIG. 3 is a plan view of the holder.

A magnetic bubble domain device, not shown, including a magnetic bubble chip, a driving coil, a bias magnet, and associated elements, is contained within a cassette C comprising a top cover $1a$ and a bottom cover $1b$, as shown in FIGS. 1 and 2. The cassette C is provided on the front side thereof with a swing lid 2. Opening the lid 2 exposes a connector 3 as shown in FIG. 2. The height $h_1$ of the top cover $1a$ is larger than the height $h_2$ of the bottom cover $1b$. Hence, the cassette C is asymmetric with respect to the junction plane between the top cover $1a$ and the bottom cover $1b$. Grooves 4 for ensuring correct insertion of the cassette are formed along the joint of the top and the bottom covers $1a$ and $1b$. A grounding metal piece 5 is disposed in the bottom surface of the groove 4, while a grounding spring 6 is secured to the holder so as to be pressed against the grounding metal piece 5. The groove 4 and the grounding metal piece 5 are provided on each side wall of the cassette C. Recesses 7 for locking or for position detection are formed in the edges between the bottom wall and the right and the left side walls of the cassette, respectively. Two parallel relief grooves 8 are formed in the top wall of the cassette. The two fingers 9 of the lid 2 are rotatably supported and can be inserted into the extremities of the relief grooves 8. Normally, the lid 2 is urged in the closing direction by means of a torsion spring (not shown).

Figure 4:
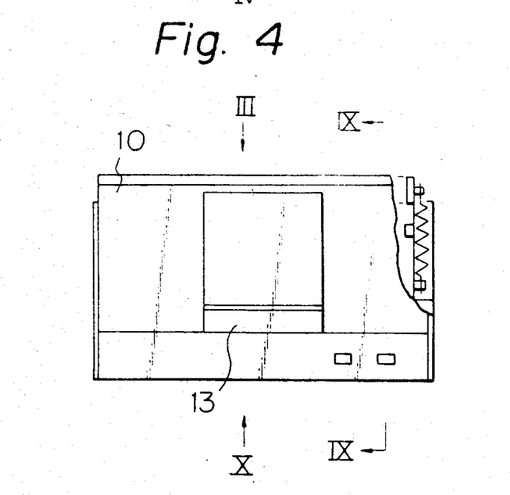
FIG. 4 is a partly broken front elevation of the holder.
Figure 5:
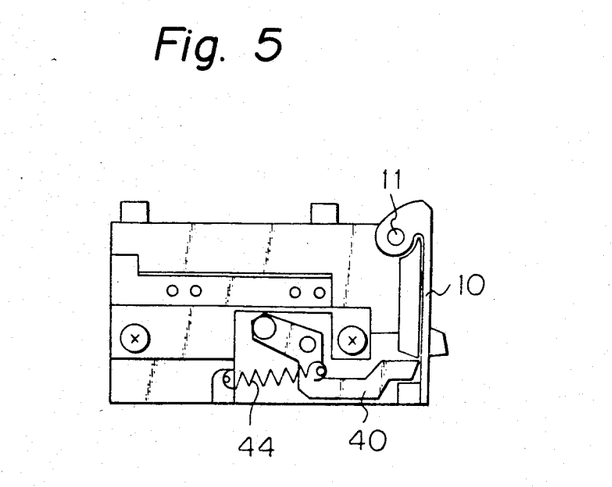
FIG. 5 is a side elevation of the left side of the holder.
Figure 8:
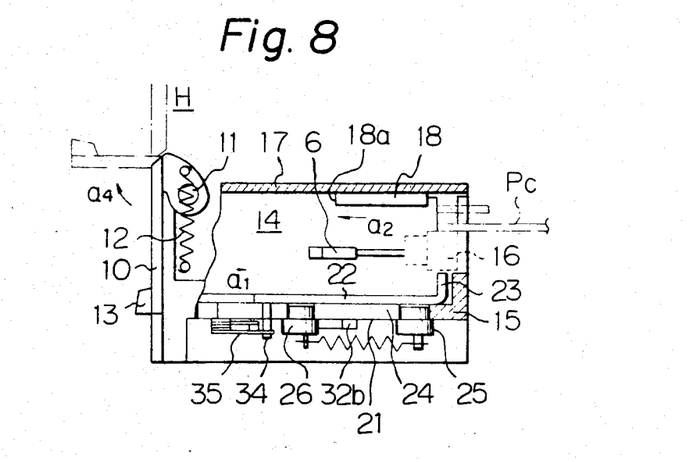
FIG. 8 is a sectional view taken along line VIII—VIII of FIG. 10.

A holder H for receiving and holding the cassette C is provided on the front side thereof with a lid 10, as shown in FIG. 4. The pivotal shaft 11 of the lid 10 is provided at the upper end of the lid 10, as shown in FIGS. 5, 6, 8, and 9. As shown in FIG. 8, a toggle spring 12 for the toggle motion of the lid 10 is arranged between the lid 10 and the body of the holder H, such that, when the lid 10 is closed, the toggle spring 12 is situated somewhat toward the lid 10 to urge the lid 10 in a closing direction. In opening the lid 10 in the direction of the arrow $a_4$ (FIG. 8) by pulling the knob 13 with a finger, the toggle spring 12 urges the lid 10 in an opening direction after the toggle spring 12 has moved backward enough to pass the pivotal shaft 11, so that the lid 10 can easily and surely be opened and closed.

Figure 7:
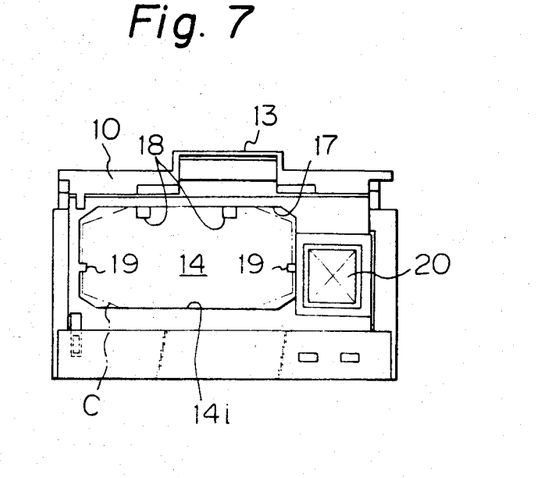
FIG. 7 is a front elevation of the holder with its cover opened.

Opening the lid 10 exposes a cassette pocket 14, as shown in FIG. 7. As viewed sideways in FIG. 8, a connector 16 is secured to the holder body 15 at the innermost position of the pocket 14. With the lid 10 of the holder opened, the cassette C is inserted through a cassette inlet $14i$ into the pocket 14 along a direction indicated by the arrow $a_1$. Thereby, the connector 16 provided within the pocket 14 and the connector 3 of the cassette C are interconnected. A printed circuit board Pc is fixed to and electrically connected to the connector 16. Peripheral circuits, such as control circuits of the magnetic bubble device, are formed in the printed circuit board Pc. Two ribs 18 corresponding to the relief grooves 8 of the cassette C are formed on the inside surface of the top panel 17 of the pocket 14 parallel to the direction of insertion of the cassette. When the cassette is inserted into the pocket 14, the fingers 9 of the cassette C are brought into abutment with the outer ends 18a (FIG. 8) of the ribs 18 and then pushed down by a force applied thereto in the direction of the arrow $a_2$ (FIG. 1). Thereafter, the ribs 18 slide over the fingers 9 of the lid 2 and along the relief grooves 8 as the cassette is inserted further into the pocket. Thus, the lid 2 of the cassette which is normally closed is opened immediately before the connectors 16 and 3 are interconnected.

As shown in FIG. 7, horizontal ribs 19 are formed on the right and the left side walls of the pocket 14 so as to be engaged with the right and the left grooves 4 of the cassette to guide the cassette as the cassette is inserted into the pocket 14 and to prevent the reverse insertion of the cassette into the pocket 14.

The cassette can be pushed by hand when inserting it into the pocket 14 through the cassette inlet 14i. An ejection button 20 is pushed in the direction of the arrow $a_1$ for discharging the cassette from the pocket 14.

Figure 10:
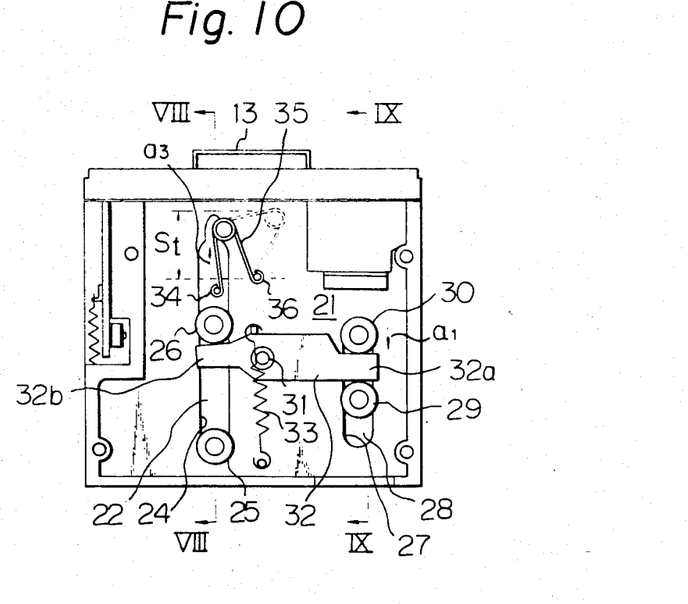
FIG. 10 is a bottom plan view of the holder.

A cassette inserting mechanism and a cassette ejecting mechanism will be discribed hereunder. A slider 22 is placed on the inside surface of the bottom panel 21 of the pocket 14. The inner end (the end on the side of the connector 16) of the slider 22 is bent vertically upward to form an integral stop plate 23. The cassette is placed on the slider 22 when being inserted into the pocket 14. A slit 24 extending along the direction of the insertion of the cassette is formed in the bottom panel 21, as shown in FIGS. 8 and 10. Two rollers 25 and 26 are secured to the slider 22 at an interval and provided over the slit 24.

Figure 9:
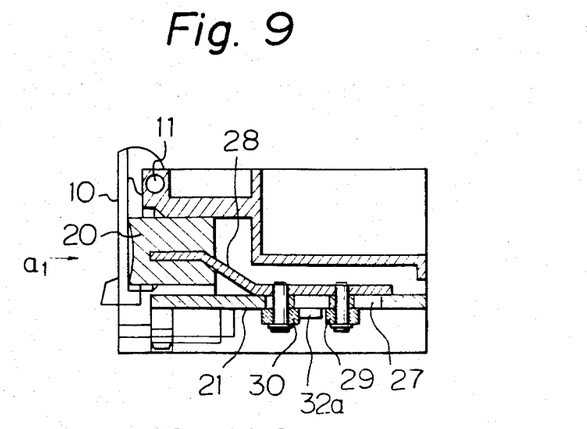
FIG. 9 is a sectional view taken along line IX—IX of FIG. 10.

On the other hand, as shown in FIGS. 9 and 10, a slit 27 extending in the direction of the front-back motion of the ejecting button 20 is formed also in the bottom panel 21 in parallel to the slit 24. Two rollers 29 and 30 are attached to the stem 28 of the ejecting button 20 and fitted in and over the slit 27. A lever 32 is supported rotatably on the bottom panel 21 by means of a pivotal shaft 31. One end 32a of the lever is held between the rollers 29 and 30 attached to the stem 28 of the ejecting button 20, while the other end 32b is located between the rollers 25 and 26 attached to the slider 22. A return spring 33 urges the rollers 29 and 30 and the ejecting button 20 in the returning direction (reverse to the direction of the arrow $a_1$) through the lever 32.

An ejection torsion spring 35 engages a pin 34 fixed to a part of the slider 22 exposed to the slit 24 and a pin 36 fixed to the bottom panel 21 to urge the slider 22 in the direction of ejecting the cassette (the direction of the arrow $a_3$). In the position shown in FIG. 10, the slider 22 is in the full stroke innermost position. When the ejection button 20 is pushed in the direction of the arrow $a_1$ against the resilient force of the spring 33, the slider 22 is retracted by the resilient force of the ejection spring 35 by a distance St to a position shown by a dotted line. The ejecting spring 35 moves to a position shown by broken lines.

As the cassette is inserted into the pocket 14, the front end of the cassette comes in contact with the stop plate 23. Since the resilient force of the ejection spring 35 is acting on the slider 22 in the direction of the arrow $a_3$, the cassette needs to be pushed further against the resilient force of the ejection torsion spring 35. Then, the slider 22 advances together with the cassette from the position shown by a dotted line in FIG. 10 to a position shown by solid lines in FIG. 8 or a broken line in FIG. 10. During the advancement of the slider 22, when the pin 34 fixed to the slider 22 and engaging one end of the ejection spring 35 passes a line corresponding to the pin 36 fixed to the bottom panel 21 and engaging the other end of the ejection spring 35, a snapping force works on the slider 22 to urge the slider 22 and the cassette toward the connector 16 (in the direction reverse to the direction indicated by the arrow $a_3$), so that insertion of the cassette and interconnection between the connectors 16 and 3 are attained easily and surely. Since the lever 32 is biased counterclockwise by the return spring 33, the lever remains at a position to keep the ejection button 20 returned, unless the ejection button is pushed.

The cassette mounted in the pocket 14 can be discharged simply by pushing the ejection button 20 against the resilient force of the return spring 33 in the direction indicated by the arrow $a_1$ in FIG. 9. When the ejection button 20 is depressed, the right end 32a of the lever 32 is moved from the position shown in FIG. 10 in the direction indicated by the arrow $a_1$, whereby the roller 26 is pushed in the direction indicated by the arrow $a_3$, so that the slider 22 is pushed back toward the cassette inlet 14i. Consequently, the stop plate 23 of the slider 22 pushes the cassette in a direction reverse to the direction indicated by the arrow $a_1$ to separate the connector 3 from the connector 16 and to eject the cassette through the cassette inlet 14i. During this cassette discharging operation, when the pin 34 moves from the position illustrated by the solid line, in FIG. 10 in the direction of the arrow $a_3$ and passes the dotted line through the pin 36, the resilient force of the ejection spring 35 works in the direction of the arrow $a_3$ so that the slider 22 and the cassette carried thereby are ejected toward the cassette inlet 14i.

As is apparent from FIG. 10, the length between the pivotal shaft 31 and the right end 32a of the lever 32 is longer than the length between the pivotal shaft 31 and the left end 32b of the lever 32 so that, with the help of the use of such leverage, a small force is effective to drive the slider 22 and to disconnect the connectors 3 and 16 from each other. In order to reduce the force necessary for the operation of the slider 22, the relative length between the pivotal shaft 31 and the left end 32b of the lever 32 should be reduced. As a result, the stroke of the left end 32b of the lever 32 is also reduced. However, the slider 22 and the cassette carried thereon can be effectively discharged by the snapping force of the ejection torsion spring 35, where the associated mechanism is constituted so that the direction of the action of the snapping force of the ejecting spring 35 is inverted within the range of the stroke of the left end 32b of the lever 32. Thus, the increase in the stroke of the slider 22 by the agency of the ejecting spring 35 compensates for the reduction in the stroke of the left end 32b of the lever 32.

Figure 11:
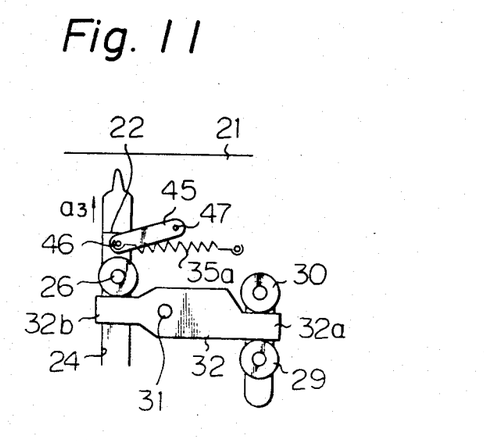
FIGS. 11 and 12 are schematic illustrations of another embodiment of a discharging spring of the slider.
Figure 12:
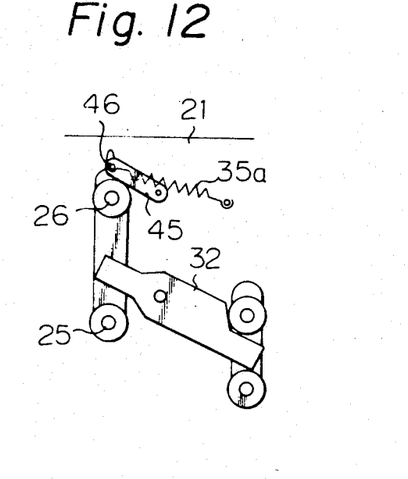

The same effect may be obtained by the use of an extension coil spring 35a instead of such a torsion spring. In FIGS. 11 and 12, one end of a swing plate 45 is connected pivotably at 47 to the bottom panel 21, while the other end thereof is connected pivotably to the slider 22 at 46 and an extension coil spring 35a is extended between the end 46 of the swing plate 45 and a predetermined position on the bottom panel 21. That is, when the coil spring 35a is positioned on the side of the lever 32 with respect to the pivotal axis 47 thereof, as illustrated in FIG. 11, the coil spring 35a biases the slider 22 toward the connector 16. Whereas, when the ejecting button 20 is operated to move the slider 22, through the lever 32, in the direction of the arrow $a_3$ and the free end 46 of the lever 32 passes the pivotal axis 47, the resilient force of the coil spring 35a acts on the swing plate 45 in the direction indicated by the arrow $a_3$ to bias the slider 22 and the cassette in the discharging direction (reverse to the direction of the arrow $a_1$), so that the condition as shown in FIG. 12 is established. When the cassette is inserted into the pocket 14 to push the slider 22 from the position of FIG. 12 to the position of FIG. 11, the direction of the action of the coil spring 35a is inverted into the reverse direction from arrow $a_3$, and thus the snapping force of the spring 35a facilitates the interconnection of the connectors 3 and 16.

The slider 22 may be formed in a box-shape to receive the cassette therein for back-and-forth movement within the pocket 14.

A mechanism for preventing the popping out of the cassette in ejecting the cassette will be described hereinafter. As described hereinbefore, the cassette C is discharged from the pocket through the movement of the slider 22 caused by the ejection spring 35 (or 35a) in the direction of the arrow $a_3$ (FIG. 10), namely, in the direction reverse to the direction of the arrow $a_1$ in FIG. 8. In this cassette discharging motion, if the cassette C is allowed to move through a distance significantly greater than the distance of movement of the slider 22 due to its inertia, it is possible that the cassette will pop out through the cassette inlet 14i of the holder H and fall accidentally on the floor. A popping prevention mechanism as described hereinafter may be employed to prevent such a popping motion of the cassette C.

Figure 13:
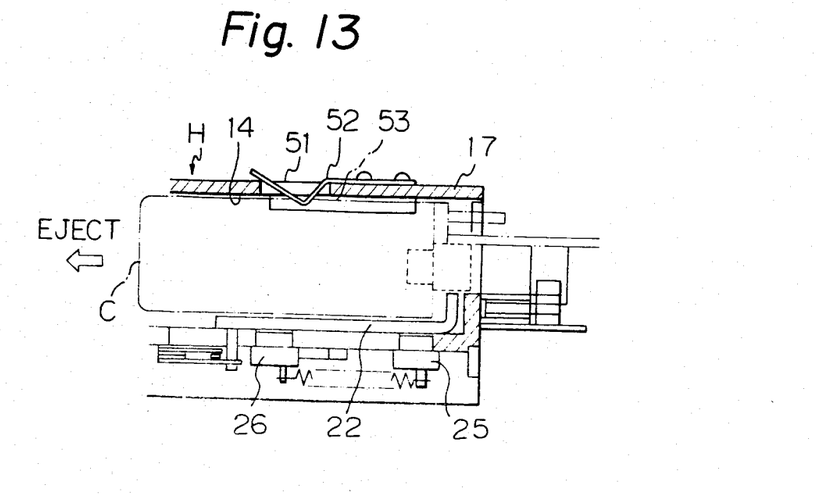
FIGS. 13, 14, and 15 are schematic illustrations of embodiments of cassette popping prevention mechanisms.

In an embodiment of the popping prevention mechanism as shown in FIG. 13, a spring mounting hole 51 is formed in the top panel 17 of the cassette pocket 14 of the holder H and a stopper 52 made of a leaf spring is attached to the upper surface of the top panel 17 with a part thereof protruding into the pocket 14 through the spring mounting hole 51. On the other hand, an elongated recess 53 (FIGS. 1 and 13) extending along the direction of insertion is formed in the top surface of the cassette C. The recess 53 engages the stopper 52 of the holder H when the cassette C is mounted in the holder H. When the cassette is ejected, one end 53a of the recess 53 of the cassette C comes into abutment with the stopper 52 of the holder H, whereby the popping-out of the cassette is prevented. In removing the cassette from the holder, pulling the cassette C causes the stopper 52 to flex and to escape from the recess 53, and thereby the cassette C can easily be dismounted.

Figure 14:
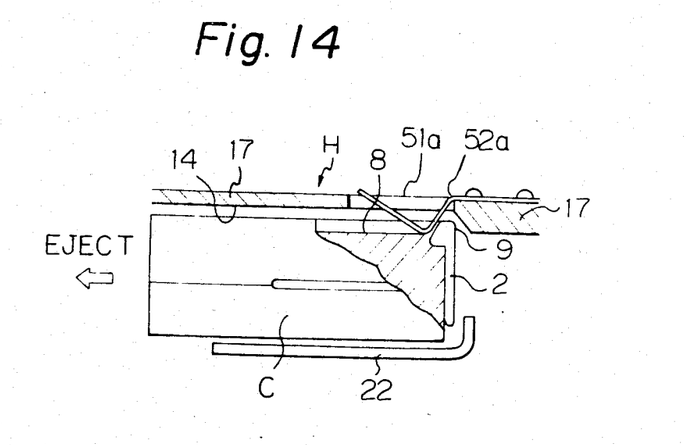

In an embodiment of the popping prevention mechanism as shown in FIG. 14, similarly to the embodiment of FIG. 13, a spring mounting hole 51a is formed in the top panel 17 of the pocket 14 of the holder H and a stopper 52a made of a leaf spring is attached to the upper surface of the top panel 17 with a part thereof protruding into the pocket 14 through the spring mounting hole 51a, whereas no particular recess is formed in the cassette C, different from the embodiment of FIG. 13. In the embodiment of FIG. 14, the relief groove 8 and the finger 9 of the lid 10 (FIGS. 1 and 2) are used for this purpose. That is, when the cassette is inserted, the stopper 52a is engaged with either of the relief grooves 8, and when the cassette is ejected, after the finger 9 of the lid 10 has passed the rib 18 formed in the upper wall of the pocket of the holder H and the lid 10 has been closed, the stopper 52a is to be engaged with the backside of the finger 9, thus preventing the popping-out of the cassette C. In dismounting the cassette C, the cassette C is pulled, similarly to the cassette dismounting procedure in the embodiment of FIG. 13, to cause the stopper 52a to flex and to escape from the finger 9 of the lid 10.

Figure 15:
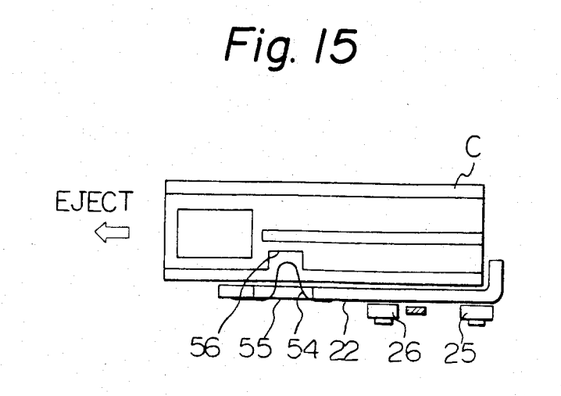
Figure 16:
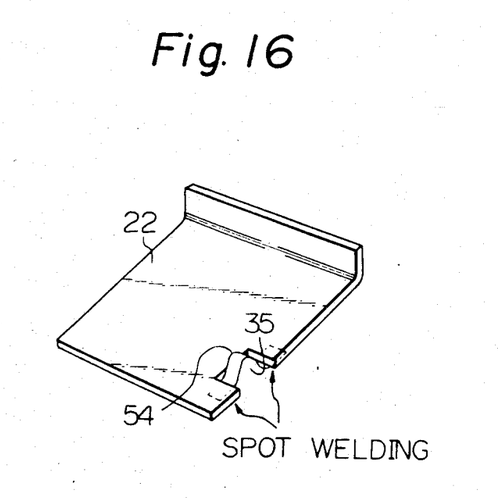
FIG. 16 is a perspective view of a part (the slider) of the cassette popping prevention mechanism of FIG. 15.

In another embodiment of the popping preventing mechanism as shown in FIGS. 15 and 16, a stopper 54 made of a leaf spring is disposed at an optional position on the slider 22 of the holder H. The stopper 54 is secured to the lower surface of the slider 22 by means of spot welding, for instance, and a part of the stopper 54 is protruded into the pocket 14 through an opening or recess 55 formed in the slider 22. On the other hand, a recess 56 is formed in the cassette C at a position corresponding to the stopper 54. When the cassette C is mounted in the pocket 14, the recess 56 engages the stopper 54. The engagement between the recess 56 and the stopper 54 allows the cassette C to move together with the slider 22 in the cassette ejecting operation and to stop as the slider 22 is stopped, thus preventing the popping-out of the cassette C. The cassette C can be dismounted from the holder H in entirely the same manner as in the embodiments of FIGS. 13 and 14. The cassette C can easily be dismounted from the holder H, since the stopper 54 flexes as the cassette C is pulled and escapes from the recess 56.

A mechanism for protecting a magnetic bubble device contained in the cassette C will be described hereinafter. If, for example, the cassette C was inadvertently ejected while operating in the holder H, the information stored in the magnetic bubble memory would be liable to be damaged. Therefore, it is necessary to stop the operation for writing or reading the information stored in the magnetic bubble memory.

Referring to FIG. 7, the ejection button 20 is disposed adjacent to the cassette inlet 14i. The lid 10 of a size capable of covering both the cassette inlet 14i and the ejecting button 20 is disposed in front of the cassette inlet 14i. Therefore, unless the lid 10 is opened, the cassette C cannot be mounted or dismounted mounted and the ejection button 20 cannot be accessed. Consequently, accidental ejecting of the cassette C due to inadvertent operation of the ejection button 20 or undue extraction of the cassette C are prevented.

Figure 6:
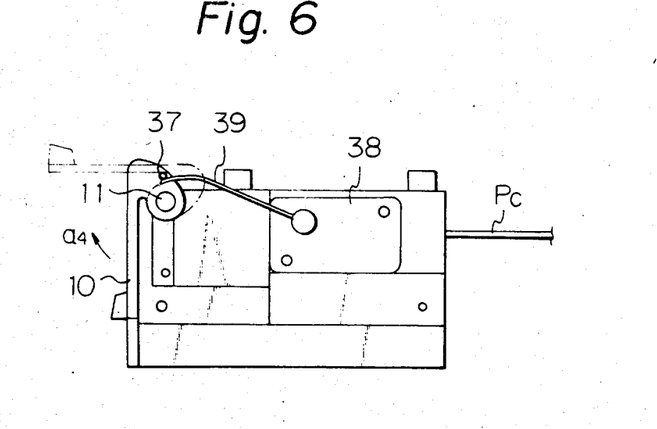
FIG. 6 is a side elevation of the right side of the holder.

When the lid 10 is opened, a signal is generated to inform the control circuit on the printed circuit board Pc of the opening. In order to provide such a signal, as shown in FIG. 6, a control pin 37 is provided on the lid 10 in the vicinity of the pivotal shaft 11 and a signal generating means such as a microswitch 38 is attached to the holder body 15. The actuator 39 of the microswitch 38 is extended to the vicinity of the control pin 37. When the lid 10 is closed as shown in FIG. 6, the control pin 37 does not work on the actuator 39. When the lid 10 is swung in the direction indicated by the arrow $a_4$ to the open position as illustrated by dotted lines, the control pin 37 depresses the actuator 39 to actuate the microswitch 38, whereby the signal is generated.

Figure 17:
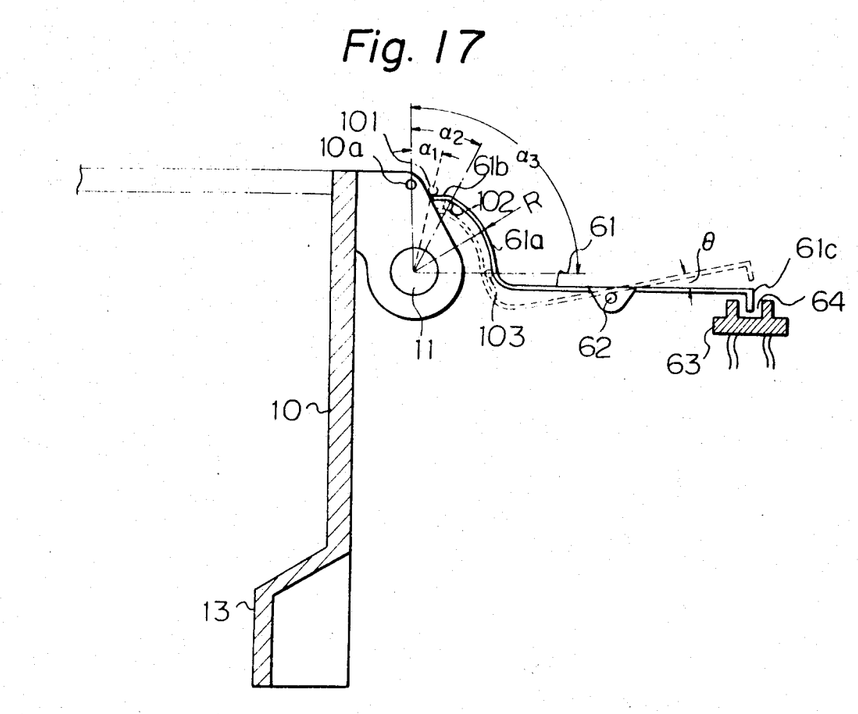
FIG. 17 is a schematic illustration of a mechanism for detecting the position of the cover of the holder.

In FIG. 17, there is shown a more preferable embodiment for obtaining the signal indicating the opening of the lid 10. In this embodiment, a lever 61 for detecting the movement of the lid 10 is provided so as to be swingable about a support pin 62. One end 61a of the lever 61 extending around the pivotal shaft 11 of the lid 10 is formed in an arcuate shape of a radius R. However, the extremity 61b of the arcuate portion 61a of the lever 61 is inclined toward the pivotal shaft 11 of the lid 10 so as to reduce the radius. While, the lid 10 has a pin 10a which is positioned, when the lid 10 is closed, in the vicinity of the inclined extremity 61b of the lever 61. In this arrangement, the pin 10a of the lid 10 comes immediately in contact with the inclined end 61b of the lever as the lid 10 is opened only slightly, by a small angle $\alpha_1$ as shown at pin 101. When the lid 10 is opened by a further angle $\alpha_2$ as shown at the pin position 102, the pin slides over and pushes the included portion 61b of the lever 61, so that the lever 61 is turned through a predetermined angle $\theta$. When the lever 61 is thus turned, the other end 61c of the lever 61 is moved out of the optical path 64 of an optical detector 63, and thereby a signal is transmitted to the printed circuit board Pc, not shown in FIG. 17. During the opening of lid 10 from angle $\alpha_2$ to the fully opened angle $\alpha_3$ as shown at pin position 103, the lever 61 is maintained in the same angular position to transmit the signal indicating the opening of the lid 10 to the printed circuit board Pc, since the pin 10a slides along the arcuate portion 61a of a constant radius R. Thus, the signal indicating the opening of the lid 10 is transmitted to the printed circuit board Pc in the initial stage of the opening operation of the lid 10 to interrupt the application of electric signals to the bubble device in the cassette, so that the operation thereof is interrupted prior to the complete opening of the lid 10.

Figure 18:
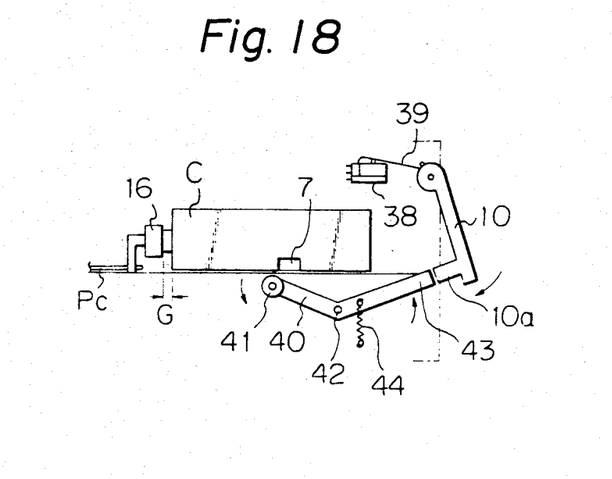
FIGS. 18 and 19 are schematic illustrations of a cassette insertion detecting mechanism.
Figure 19:
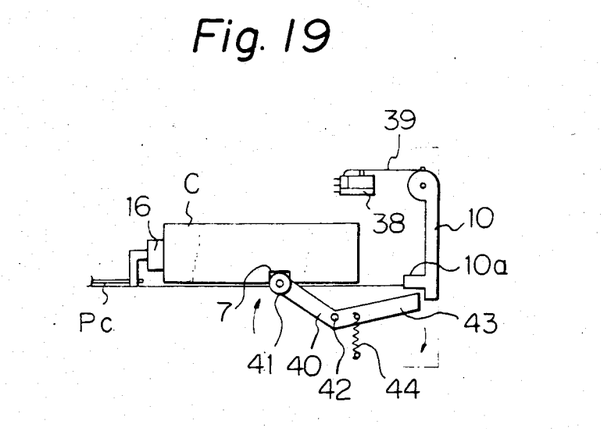

FIGS. 18 and 19 are schematic left side elevations of the pocket containing the cassette C. The cassette is inserted into the pocket imperfectly in FIG. 18, whereas the cassette is mounted correctly at the right position within the pocket in FIG. 19. When the cassette C is perfectly inserted in the pocket as shown in FIG. 19, the connector 3 of the cassette C is surely connected to the connector 16, and the roller 41 of a lever 40 is fitted in a recess 7 formed in the bottom surface of the cassette. However, when the cassette is imperfectly inserted into the pocket, and hence a gap G is formed between the cassette C and the connector 16, the recess 7 of the cassette is not in alignment with the roller 41. Therefore, the roller 41 cannot be fitted in the recess 7. The lever 40 is attached to the holder body by means of a pivotal shaft 42. One end of the lever 40 is provided with the roller 41 and the other end 43 is extended to the vicinity of the lower end of the lid 10. A spring 44 urges the lever 40 so that the roller 41 will enter the recess 7. On the other hand, the lid 10 is provided with a protrusion 10a, which interferes with the other end 43 of the lever 40 when the roller 41 is not allowed to enter the recess 7 due to the incomplete insertion of the cassette C as shown in FIG. 18.

Thus, when the roller 41 is not allowed to enter the recess 7 due to the incomplete insertion of the cassette, the other end 43 of the lever remains at a raised position and interferes with the protrusion 10a of the lid 10, thus obstructing the complete closing of the lid 10. When the cassette C is completely inserted into the pocket to allow the roller 41 to enter the recess 7 as shown in FIG. 19, the other end 43 of the lever is released from the protrusion 10a. Consequently, the lid 10 can be completely closed without being obstructed by the other end 43 of the lever. When the lid 10 cannot be closed completely, the microswitch 38 is actuated to provide a detection signal, which is transmitted to the control circuit. Upon the reception of the detection signal, the control circuit detects the incomplete insertion of the cassette and controls the associated circuits so as not to drive the magnetic bubble device. The magnetic bubble device can be driven only when the cassette is completely inserted into the pocket as shown in FIG. 19. Although the microswitch 38 for generating a signal indicating the opening of the lid 10, which has been described in connection with FIG. 6, is used also as a means to generate a signal indicating the incomplete insertion of the cassette, separate detecting means may be provided for those separate purposes. The detecting means may be an optical device consisting of a light-projecting element and a light-receiving element, instead of a mechanical microswitch. The means to detect the incomplete insertion of the cassette may be arranged so as to detect the position of the lever directly to detect whether or not the roller 41 is at the upper position, instead of detecting the position of the lid.

The condition of the insertion of the cassette may also be detected through the detection of the position of the slider 22 of the holder H or that of the rollers 25 and 26 (FIG. 10) attached to the slider 22. The provision of an AND circuit for processing both the detection signal indicating the condition of the insertion of the cassette and the detection signal indicating the condition of the closing of the lid 10 will further ensure the prevention of the erroneous operation of the cassette. Consequently, a power supply can be connected to the cassette only when the cassette is inserted completely into the pocket with the connectors being completely connected, and when the lid 10 is closed completely; but cannot be connected to the cassette unless the above-mentioned conditions are established. This is, therefore, capable of preventing the erroneous operation of the magnetic bubble memory.

We claim:

1. A cassette-type magnetic bubble memory comprising:
   a magnetic bubble cassette including a first connector and a case for containing a magnetic bubble device, said magnetic bubble device including a magnetic bubble chip, a driving coil, and a bias magnet; and
   a cassette holder having a cassette storing pocket with an inlet thereto and a second connector, for holding said magnetic bubble cassette with said first and second connectors connected to each other, said cassette holder further comprising:
     an ejection mechanism for discharging the magnetic bubble cassette from said cassette storing pocket;
     an ejection button for controlling the ejection mechanism, said ejection button having a stem;
     a lid provided in front of said inlet of the cassette storing pocket, said lid being formed of a size for closing said inlet of the cassette storing pocket and for concealing said ejection button when said lid is closed;
     means for detecting the position of the lid to generate a respective detection signal: and
     a slider for sliding forward and backward with said cassette mounted thereon, said slider having a stopping member for driving said cassette in a respective cassette ejection direction, and a lever interposed as a leverage member of the ejection mechanism between said stem of the ejection button and the slider, wherein said lever transmits an operation force applied to the ejection button via said slider to the cassette.

2. A memory according to claim 1, wherein a torsion spring connects said slider to the body of said cassette holder, and said slider is adapted to be moved in said cassette ejection direction by the force of said torsion spring after said slider has been moved slightly in said cassette ejection direction in response to the operation of said lever.

3. A memory according to claim 1, wherein the ejection mechanism includes means for preventing a popping-out of the cassette when said cassette is ejected.

4. A memory according to claim 3, wherein said means for preventing popping-out of the cassette comprises a leaf spring means slightly projecting into said cassette storing pocket and a recess formed in the cassette at a position corresponding to the leaf spring means, and said leaf spring means is adapted to enter said recess to prevent the popping-out motion of the cassette when the cassette is ejected.

5. A memory according to claim 1, wherein said case of said cassette is formed of an insulating material, and a grounding terminal for grounding said cassette and a grounding terminal of the holder are connected before said first connector of the cassette is connected to said second connector of the holer when said cassette is inserted into said holder.

6. A cassette-type magnetic bubble memory comprising:
a magnetic bubble cassette including a first connector and a case for containing a magnetic bubble device, said magnetic bubble device including a magnetic bubble chip, a driving coil, and a bias magnet; and
a cassette holder having a cassette storing pocket with an inlet thereto and a second connector, for holding said magnetic bubble cassette with said first and second connectors connected to each other, said cassette holder further comprising:
an ejection mechanism for discharging the magnetic bubble cassette from said cassette storing pocket;
an ejection button for controlling the ejection mechanism, said ejection button having a stem;
a lid provided in front of said inlet of the cassette storing pocket, said lid being formed of a size for closing said inlet of the cassette storing pocket and for concealing said ejectin button when said lid is closed;
means for detecting the position of the lid to generate a respective detection signal; and
a slider for sliding forward and backward with said cassette mounted thereon, said slider having a stopping member for driving said cassette in a respective cassette ejection direction, and a lever interposed as a leverage member of the ejection mechanism between stem of the ejection button and the slider, wherein said lever transmits an operation force applied to the ejection button via said slider to the cassette;
wherein said ejection mechanism includes means for preventing popping-out of the cassette when said cassette is ejected including an elastic member connected to said slider, said slider slides forward and backward with said cassette thereon during the insertion and ejection of said cassette, and a recess is provided in said cassette so as to engage said elastic member.

7. A cassette-type magnetic bubble memory comprising
a magnetic bubble cassette provided with a first connector and a case containing a magnetic bubble device which includes a magnetic bubble chip, a driving coil and a bias magnet,
a cassette holder having a cassette storing pocket and a second connector to hold said magnetic bubble cassette with said first and second connectors connected to each other,
said magnetic bubble cassette having a recess for detecting the position of said cassette, and
said cassette holder having an inlet for said cassette and including
a swing lid for concealing said inlet of the cassette holder when the swing lid is closed, said swing lid having a projection, and
a swing lever having an engaging part that enters said recess in the magnetic bubble cassette when said cassette is fully inserted in said cassette storing pocket, and an obstructing part corresponding to said projection in the lid for interfering with said projection to obstruct the closing of said lid when said cassette is incompletely inserted in said cassette storing pocket, wherein said obstructing part of the lever does not obstruct the closing of the lid when the magnetic bubble cassette is completely inserted into the cassette holder, and said engaging part of the lever does not enter the recess in the magnetic bubble cassette when the magnetic bubble cassette is incompletely inserted into the cassette holder.

8. A cassette-type magnetic bubble memory comprising
a magnetic bubble cassette having a recess for detecting the position of said cassette and including a first connector and a case containing a magnetic bubble device which includes a magnetic bubble chip, a driving coil and bias magnet,
a cassette holder having a cassette storing pocket and a second connector to hold said magnetic bubble cassette with said first and second connectors connected to each other,
said magnetic bubble cassette being provided with a lid which when closed covers said second connector, said lid including a first projection,
said cassette holder being provided with ribs in said cassette storing pocket for opening the lid of the cassette when said ribs are brought into abutment with said first projection of the lid of the cassette during insertion of the cassette into the cassette holder, said cassette holder further including,
an ejection mechanism for ejecting the magnetic bubble cassette from the cassette storing pocket of the cassette holder,
an ejection button for controlling the ejecting mechanism,
a slider in said cassette storing pocket for sliding forward and backward with the magnetic bubble cassette mounted thereon,
said slider including a stop member for driving the magnetic bubble cassette in a direction for ejection of the magnetic bubble cassette,
a first lever interposed between the slider and the ejection button to transmit an operating force applied to the ejection button through the slider to the magnetic bubble cassette, a further lid of a size capable of closing said cassette inlet of the cassette storing pocket and of concealing the ejection button when closed, provided in front of the cassette inlet, said further lid including a projecting part, a swing lever having at one end thereof an engaging part adapted to enter said recess in the magnetic bubble cassette when said magnetic bubble cassette is fully inserted in said cassette storing pocket, for detecting the position of said cassette, and at the other end thereof an obstructing part for obstructing the closing of said further lid, by contacting said projecting part of said further lid when said engaging part of the swing lever is not allowed to enter the recess formed in the magnetic bubble cassette, so that said lid is prevented from closing when said cassette is not fully inserted in said cassette storing pocket, and means for detecting the position of the lid of the cassette holder to generate an electric detection signal.

* * * * *

UNITED STATES PATENT AND TRADEMARK OFFICE
CERTIFICATE OF CORRECTION

PATENT NO. : 4,630,236

DATED : December 16, 1986

INVENTOR(S) : Sukeda et al.

It is certified that error appears in the above-identified patent and that said Letters Patent is hereby corrected as shown below:

Col. 3, line 65, "ejecting" should be --ejection--.

Col. 4, line 57, "ejecting" should be --ejection--;
        line 60, "ejecting" should be --ejection--.

Col. 6, line 44, "ejecting" should be --ejection--;
        line 49, "or" should be --and--.

Col. 7, line 15, "included" should be --inclined--.

Col. 9, line 48, "ejectin" should be --ejection--.

Signed and Sealed this

Fourteenth Day of April, 1987

Attest:

DONALD J. QUIGG

Attesting Officer

Commissioner of Patents and Trademarks